United States Patent
Lee et al.

(10) Patent No.: US 9,870,808 B2
(45) Date of Patent: Jan. 16, 2018

(54) MEMORY DEVICE FOR PERFORMING CALIBRATION OPERATION

(71) Applicant: Samsung Electronics Co., Ltd., Suwon-si (KR)

(72) Inventors: Hyunui Lee, Osan-si (KR); Won-joo Yun, Yongin-si (KR); Hye-seung Yu, Goyang-si (KR); In-dal Song, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/295,571

(22) Filed: Oct. 17, 2016

(65) Prior Publication Data

US 2017/0162238 A1 Jun. 8, 2017

(30) Foreign Application Priority Data

Dec. 2, 2015 (KR) .................. 10-2015-0170665

(51) Int. Cl.

| | |
|---|---|
| *G11C 7/00* | (2006.01) |
| *G11C 7/12* | (2006.01) |
| *G06F 3/06* | (2006.01) |
| *G11C 7/22* | (2006.01) |
| *G11C 8/08* | (2006.01) |
| *G11C 8/14* | (2006.01) |
| *G11C 29/12* | (2006.01) |

(52) U.S. Cl.
CPC .............. *G11C 7/12* (2013.01); *G06F 3/0608* (2013.01); *G06F 3/0652* (2013.01); *G06F 3/0656* (2013.01); *G06F 3/0673* (2013.01); *G11C 7/22* (2013.01); *G11C 8/08* (2013.01); *G11C 8/14* (2013.01); *G11C 29/12* (2013.01)

(58) Field of Classification Search
CPC .... G11C 7/12; G11C 7/22; G11C 8/08; G11C 8/14; G11C 5/147; G11C 5/145
USPC ................. 365/189.09, 189.06, 189.05, 198
See application file for complete search history.

(56) References Cited

U.S. PATENT DOCUMENTS

| | | |
|---|---|---|
| 6,188,237 B1 | 2/2001 | Suzuki et al. |
| 6,307,791 B1 | 10/2001 | Otsuka et al. |
| 6,356,105 B1 | 3/2002 | Volk |
| 7,737,712 B2 | 6/2010 | Kim et al. |
| 7,782,079 B2 | 8/2010 | Park |
| 7,924,048 B2 | 4/2011 | Oh et al. |
| 7,969,182 B2 | 6/2011 | Kim et al. |
| 8,363,443 B2 | 1/2013 | Chevallier et al. |
| 8,654,573 B2 | 2/2014 | Gillingham et al. |
| 8,878,565 B2 | 11/2014 | Hara |

(Continued)

*Primary Examiner* — Connie Yoha
(74) *Attorney, Agent, or Firm* — Muir Patent Law, PLLC

(57) ABSTRACT

Provided is a memory device configured to perform a calibration operation without having a ZQ pin. The memory device includes a calibration circuit configured to generate a pull-up calibration code and a pull-down calibration code which termination of a data input/output pad for impedance matching in the data input/output pad is controlled. The calibration circuit performs a first calibration operation for trimming first and second reference resistors based on an external resistor to be connected to a pad, and a second calibration operation for generating the pull-up calibration code and the pull-down calibration code based on the trimmed second reference resistor.

20 Claims, 12 Drawing Sheets

(56) References Cited

U.S. PATENT DOCUMENTS

| | | | | |
|---|---|---|---|---|
| 2009/0002018 A1* | 1/2009 | Jeong | ................... | H04L 25/028 |
| | | | | 326/30 |
| 2012/0306543 A1* | 12/2012 | Matsuoka | ............ | G11C 7/1057 |
| | | | | 327/108 |
| 2015/0063041 A1 | 3/2015 | Arai | | |
| 2015/0115999 A1 | 4/2015 | Lee | | |
| 2016/0359484 A1* | 12/2016 | Fujisawa | ................ | G11C 29/02 |

* cited by examiner

MEMORY DEVICE FOR PERFORMING CALIBRATION OPERATION

CROSS-REFERENCE TO RELATED APPLICATION

This application claims priority under 35 USC §119 to Korean Patent Application No. 10-2015-0170665, filed on Dec. 2, 2015, in the Korean Intellectual Property Office, the disclosure of which is incorporated herein in its entirety by reference.

BACKGROUND

The present disclosure relates to a semiconductor device, and more particularly, to a semiconductor device configured to perform a calibration operation without having a ZQ pin.

A swing width of signals is decreasing so as to minimize a transmission time of signals interfacing between semiconductor devices. As the swing width of the signals decreases, an effect of external noise on the semiconductor devices increases, and signal reflection that may be caused by impedance mismatching in an interface may become a serious problem. If impedance mismatch occurs, it may be difficult to transmit data at a high speed, and data output from an output terminal of a semiconductor device may be distorted. Accordingly, since the semiconductor device for receiving the data may receive a distorted signal, problems such as a setup/hold failure, misjudgment, or the like may frequently occur.

In order to address these issues, memory devices include a ZQ pin, and control impedance matching by receiving a ZQ calibration command (for example, ZQ calibration short (ZQCS) or ZQ calibration long (ZQCL)) from outside and performing ZQ calibration. From among memory devices, a memory device that does not have a ZQ pin may also need to perform a calibration operation for accurate impedance matching.

SUMMARY

The present disclosure provides a calibration circuit configured to perform a calibration operation without using a ZQ pin.

The present disclosure provides a memory device including the calibration circuit.

According to aspects of the inventive concept, there is provided a calibration circuit of a memory device including: a first calibration circuit configured to generate a trimming code for trimming a first reference resistor, based on an external resistor connected to a pad of the memory device; and a second calibration circuit configured to trim a second reference resistor in response to the trimming code, and generate a pull-up calibration code and a pull-down calibration code based on the trimmed second reference resistor. The memory device may include a pull-up driver configured to receive the pull-up calibration code and a pull-down driver configured to receive the pull-down calibration code. The pull-up driver and the pull-down driver may be connected to a data input/output pad of the memory device. Thus, termination of the data input/output pad may be controlled in response to the pull-up calibration code and the pull-down calibration code.

According to other aspects of the inventive concept, there is provided a memory device including: a memory buffer including conductive terminals to perform an external interfacing function of the memory device; and memory layers stacked on the memory buffer, electrically connected to the memory buffer via through substrate vias, and each of the memory layers including channels providing an interface independent from the memory buffer, wherein the memory buffer includes a calibration circuit configured to trim a first reference resistor and a second reference resistor based on an external resistor to be connected to a conductive terminal and generate a pull-up calibration code and a pull-down calibration code based on the trimmed second reference resistor, and termination of a data input/output pad (a DQ pad) of each of the channels is controlled in response to the pull-up calibration code and the pull-down calibration code.

According to still other aspects of the inventive concept, there is provided a memory device including: a DQ pad, an output driver including a pull-up driver and a pull-down driver each connected to the DQ pad and configured to provide a data signal to the DQ pad, and a calibration circuit configured to generate a trimming code to trim a first reference resistor and a second reference resistor based on an external resistor to be connected to an internal pad, and configured to generate a pull-up calibration code and a pull-down calibration code provided to the pull-up driver and the pull-down driver, respectively, based on the trimmed second reference resistor. The DQ pad may be configured to be connected to outside of the memory device and the internal pad may be configured to be not connected to outside of the memory device.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
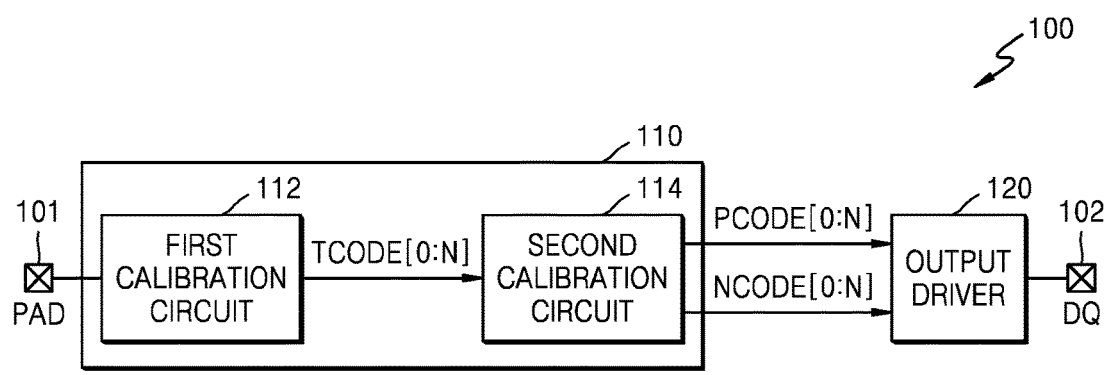
FIG. 1 illustrates a diagram for explaining a memory device including a calibration circuit, according to example embodiments.

The attached drawings for illustrating embodiments are referred to in order to gain a sufficient understanding of the embodiments, the merits thereof, and the objectives accomplished by the implementation of the embodiments.

Exemplary embodiments will now be described more fully with reference to the accompanying drawings. Like reference numerals in the drawings denote like elements, and thus their description will be omitted. In the drawings, the lengths and sizes of layers and regions are exaggerated for clarity.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Expressions such as "at least one of," when preceding a list of elements, modify the entire list of elements and do not modify the individual elements of the list.

FIG. 1 illustrates a diagram for explaining a memory device 100 including a calibration circuit 110, according to example embodiments.

Referring to FIG. 1, the memory device 100 includes a calibration circuit 110 and an output driver 120. The calibration circuit 110 is connected between a pad 101 and the output driver 120 included in the memory device 100. The calibration circuit 110 generates a pull-up calibration code PCODE[0:N] and a pull-down calibration code NCODE[0:N] for terminating the output driver 120 according to an external resistor connected to the pad 101. The calibration circuit 110 includes a first calibration circuit 112 and a second calibration circuit 114. In example embodiments, a number of bits of the pull-up calibration code PCODE[0:N] may be different from a number of bits of the pull-down calibration code NCODE[0:M]. Each of n and m is a positive integer.

The memory device 100 may include a plurality of pins respectively connected to a corresponding pad of a plurality of pads of the memory device 100. Thus, the memory device 100 may communicate with outside (e.g., with a memory controller) by the pins of the memory device 100. As such, "pins" of a device as described herein refers to a terminal for connecting to the outside of the device. These pins may also be referred to as "external connection pins." In example embodiments, the pad 101 of the memory device 100 is not connected to any pin of the memory device 100. In other example embodiments, the pad 101 of the memory device 100 is connected to a pin (e.g., a first pin) of the memory device 100. In one embodiment, the first pin of the memory device 100 may not be used in a normal operation (e.g., a read or write operation) for the memory device 100.

The first calibration circuit 112 may generate a trimming code TCODE[0:N] for trimming a first reference resistor, based on the external resistor connected to the pad 101, where N is a positive integer. The second calibration circuit 114 may trim a second reference resistor in response to the trimming code TCODE[0:N], and generate a pull-up calibration code PCODE[0:N] and a pull-down calibration code NCODE[0:N] based on the trimmed second reference resistor. In example embodiments, a number of each of the pull-up calibration code PCODE[0:N] and a pull-down calibration code NCODE[0:N] may be different from each other. The first reference resistor or the second reference resistor may be trimmed to have a resistance value the same as that of the external resistor connected to the pad 101. In example embodiments, a resistance value of each of first reference resistor and the second reference resistor may be trimmed to have a different resistance value from each other. Thus, a structure of the first reference resistor may be different from a structure of the second reference resistor.

The output driver 120 includes a pull-up driver for pull-up terminating a data input/output pad 102 (e.g., a DQ pad) in response to the pull-up calibration code PCODE[0:N], and a pull-down driver for pull-down terminating the data input/output pad 102 in response to the pull-down calibration code NCODE[0:N]. The DQ pad is connected to a DQ pin of the memory device 100 to transmit or receive a data signal to or from outside of the memory device 100.

The calibration circuit 110 may perform a first calibration operation for trimming the first and second reference resistors based on the external resistor connected to the pad 101, and a second calibration operation for generating the pull-up calibration code PCODE[0:N] and the pull-down calibration code NCODE[0:N] based on the trimmed second reference resistor. Termination of the data input/output pad 102 of the output driver 120 is controlled in response to the pull-up calibration code PCODE[0:N] and the pull-down calibration code NCODE[0:N], so that impedance matching in the data input/output pad 102 may be accurately performed.

Figure 2:
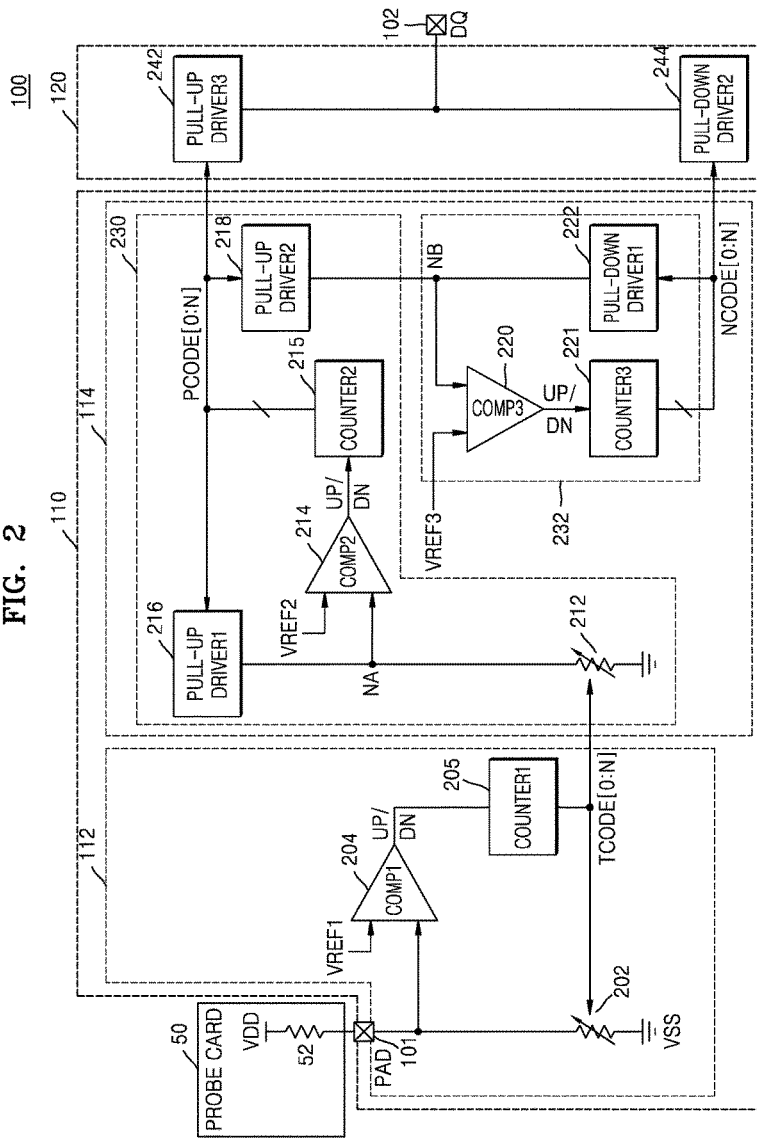
FIGS. 2 through 5 illustrate diagrams for explaining the calibration circuit shown in FIG. 1 according to example embodiments.
Figure 3:
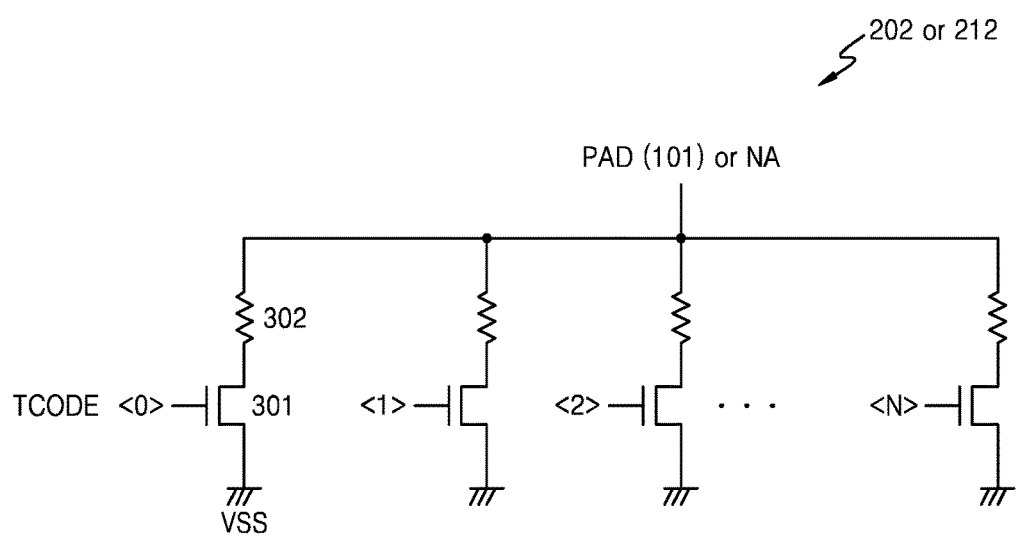
Figure 4:
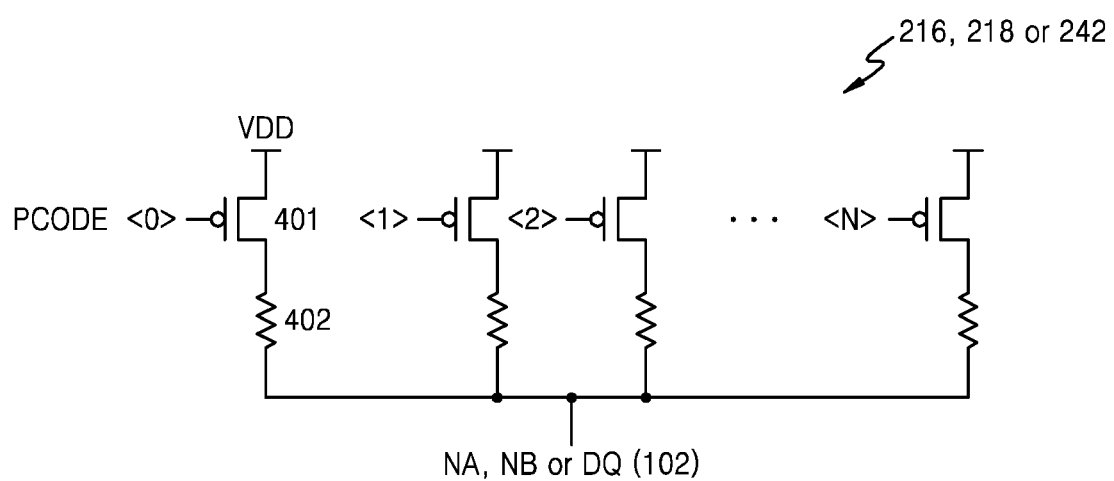
Figure 5:
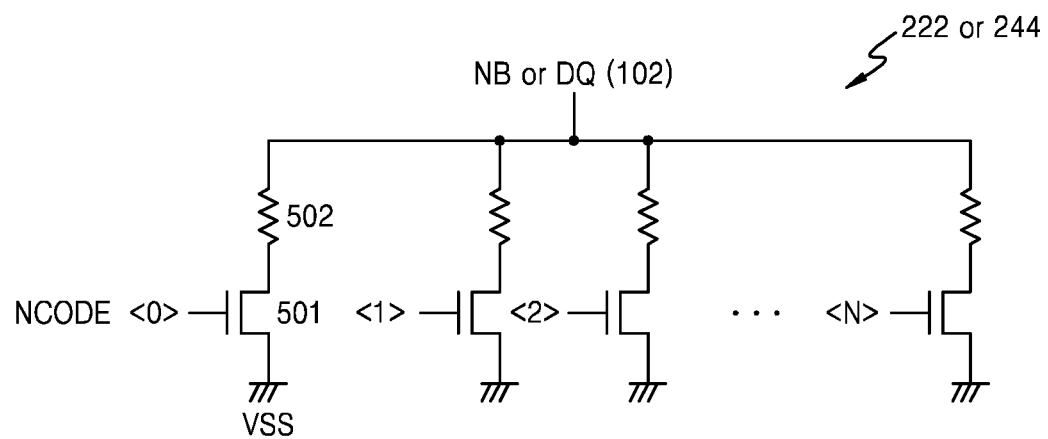

FIGS. 2 through 5 illustrate diagrams for explaining the calibration circuit 110 shown in FIG. 1 according to example embodiments. FIG. 2 illustrates a diagram for explaining a block diagram of the calibration circuit 110. FIG. 3 illustrates a diagram for explaining reference resistors 202 and 212. FIG. 4 illustrates a diagram for explaining pull-up drivers 216, 218 and 242. FIG. 5 illustrates a diagram for explaining pull-down drivers 222 and 244.

Referring to FIG. 2, the calibration circuit 110 includes a first calibration circuit 112 and a second calibration circuit 114. The first calibration circuit (or, a first calibrator) 112 includes a first reference resistor 202, a first comparator 204, and a first counter 205.

The first reference resistor 202 is connected between the pad 101 and a source of a ground voltage VSS (e.g., a ground), and a resistance value of the first reference resistor 202 may vary according to a trimming code TCODE[0:N] output from the first counter 205. As shown in FIG. 3, the first reference resistor 202 may include N-type metal oxide semiconductor (NMOS) transistors 301 configured such that the trimming code TCODE[0:N] is to gates of the NMOS transistors 301, and resistors 302 serially connected to the NMOS transistors 301. The NMOS transistors 301 and the resistors 302 are located between the pad 101 and a source of the ground voltage VSS. A gate of at least one of the NMOS transistors 301 serially connected to one of the resistors 302 may be connected to a power voltage VDD, thus, a calibration operation of the memory device 100 may be performed during a power up period of the memory device 100.

The first comparator 204 may compare a first reference voltage VREF1 to a voltage of the pad 101, and transmit a result of the comparison to the first counter 205 by using an up/down signal UP/DN. The first comparator 204 may perform a comparison operation until the voltage of the pad 101 becomes the same as the first reference voltage VREF1.

A voltage of the pad 101 may be determined by an external resistor 52 of a test device 50, and the first reference resistor 202. The pad 101 may be connected to the test device 50 located outside the memory device 100. The test device 50 may be a probe test device for testing whether the memory device 100 normally operates when the memory device 100 is in a wafer form. The probe test device 50 may have a card form, and thus, be referred to as a probe card.

The test device 50 includes a plurality of probe tips, and the plurality of probe tips may be classified into power tips for applying a power voltage VDD, ground tips for applying a ground voltage VSS, and signal tips for inputting/outputting a signal. The plurality of probe tips may contact pads included in the memory device 100, and measure an output signal output according to an input signal applied to each of the pads.

Some pads, from among a plurality of pads included in the memory device 100, may not be used when the memory device 100 is operated in a normal operation (e.g., a read or write operation). In example embodiments, the memory device 100, which performs a calibration operation in a wafer form by using the pad 101 that has not been used when the memory device 100 is operated in the normal operation, is to be described. According to example embodiments, a pin or a ball, which is connected to the pad 101 that is not used, may be connected to the test device 50 so as to perform a calibration operation on the memory device 100 in a package form.

The first comparator 204 may compare a voltage of the pad 101 to a first reference voltage VREF1. If the voltage of the pad 101 is higher than the first reference voltage VREF1, the first comparator 204 may output the up signal UP. The up signal UP may increase a number of resistors of the first resistor 202, by increasing a trimming code TCODE[0:N] of the first counter 205 and increasing a number of the NMOS transistors 301 turned on that are shown in FIG. 3. As a number of the resistors that are located in the first resistor 202 and connected to each other in parallel increases, a resistance value of the first resistor 202 decreases, and thus, a voltage level of the pad 101 connected to the first resistor 202 decreases. Such an operation may be repeatedly performed until the voltage of the pad 101 decreases, and thus, become the same as the first reference voltage VREF1.

If the voltage of the pad 101 is lower than the first reference voltage VREF1, the first comparator 204 may output the down signal DN. The down signal DN may decrease a number of the resistors of the first resistor 202, by decreasing a trimming code TCODE[0:N] of the first counter 205 and decreasing a number of the NMOS transistors 301 turned on that are shown in FIG. 3. As a number of the resistors that are located in the first resistor 202 and connected to each other in parallel decreases, a resistance value of the first resistor 202 increases, and thus, a voltage level of the pad 101 connected to the first resistor 202 increases. Such an operation may be repeatedly performed until the voltage of the pad 101 increases, and thus, becomes the same as the first reference voltage VREF1.

The first counter 205 may perform an up/down count operation in response to the up/down signal UP/DN of the first comparator 204, and thus, generate the trimming code TCODE[0:N]. The trimming code TCODE[0:N] may be provided to the first reference resistor 202 and the second reference resistor 212.

In certain embodiments, the first calibration circuit 112 may determine the first reference voltage VREF1 so that the first reference voltage VREF1 corresponds to a half of the power voltage VDD, and thus, generate the trimming code TCODE[0:N] so that a resistance value of the external resistor 52 in the test device 50 connected to the pad 101 becomes the same as a resistance value of the first reference resistor 202. According to example embodiments, the first calibration circuit 112 may change the first reference voltage VREF1 to have a voltage, for example, less than a half power voltage VDD, and thus, generate the trimming code TCODE[0:N] so that a resistance value of the external resistor 52 in the test device 50 connected to the pad 101 is different from a resistance value of the first reference resistor 202. For example, the resistance value of the external resistor 52 in the test device 50 may be 5-10 times the resistance value of the first reference resistor 202. In example embodiments, the trimming code TCODE[0:N] may be determined at a wafer form of the memory device 100, and the first counter 205 may store the determined the trimming code TCODE[0:N] in a first register (not shown). The first counter 205 may include the first register.

The second calibration circuit 114 may include a second calibrator 230 and a third calibrator 232. The second calibrator 230 may include a second reference resistor 212, a second comparator 214, a second counter 215, a first pull-up driver 216, and a second pull-up driver 218. The third calibrator 232 may include a third comparator 220, a third counter 221, and a first pull-down driver 222.

The second reference resistor 212 is connected between a first node NA and a source of the ground voltage VSS, and a resistance value of the second reference resistor 212 may vary depending on a trimming code TCODE[0:N] of the first counter 205 included in the first calibration circuit 112. A resistance value of the second reference resistor 212 may be the same as that of the external resistor 52 in the test device 50 and the first reference resistor 202 in the first calibration circuit 112. According to example embodiments, a resistance value of the second reference resistor 212 may be different from that of the external resistor 52 in the test device 50 and that of the first reference resistor 202 of the first calibration circuit 112. For example, the resistance value of the second reference resistor 212 may be greater than the resistance value of the first reference resistor 202. In this case, a structure of the second reference resistor 212 of FIG. 3 may be different from the first reference resistor 202. For example, a resistor (not shown) may be serially connected to each of the resistors 302. Thus, a resistance value of the second reference resistor 212 may be greater than a resistance value of the first reference resistor 202 based on the same trimming code TCODE[0:N].

The second comparator 214 may compare a second reference voltage VREF2 to a voltage of the first node NA, and transmit a result of the comparison to the second counter 215 as an up/down signal UP/DN. The second comparator 214 may perform the comparing operation until the voltage of the first node NA becomes the same as the second reference voltage VREF2. The second reference voltage VREF2 may have a voltage level the same as that of the first reference voltage VREF1. According to example embodiments, the second reference voltage VREF2 may have a voltage level different from that of the first reference voltage VREF1. For example, the second reference voltage VREF2 may have a voltage level greater than that of the first reference voltage VREF1. In example embodiments, a voltage level of the second reference voltage VREF2 may be a half power voltage VDD.

The second counter 215 may perform an up/down count operation in response to the up/down signal UP/DN of the second comparator 214, and thus, generate a pull-up calibration code PCODE[0:N]. The pull-up calibration code PCODE[0:N] may be provided to the first pull-up driver 216, the second pull-up driver 218, and a third pull-up driver 242 (e.g., a data pull-up driver) included in the output driver 120.

The first pull-up driver 216 may calibrate a resistance value of the first pull-up driver 216 in response to the pull-up calibration code PCODE[0:N]. As shown in FIG. 4, the first pull-up driver 216 may include P-type metal oxide semiconductor (PMOS) transistors 401 configured such that the pull-up calibration code PCODE[0:N] is input to gates of the PMOS transistors 401, and resistors 402 serially connected to the PMOS transistors 401. The PMOS transistors 401 and the resistors 402 are located between the source of the power voltage VDD and the first node NA.

A voltage of the first node NA may be determined by distributing a voltage between the source of the power voltage VDD and the source of the ground voltage VSS according to a resistance value of the first pull-up driver 216 and a resistance value of the second reference resistor 212. The second comparator 214, the second counter 215, and the first pull-up driver 216 may compare the voltage of the first node NA to the second reference voltage VREF2 until the voltage of the first node NA becomes the same as the second reference voltage VREF2. Then, according to a result of the comparison, the second comparator 214, the second counter 215, and the first pull-up driver 216 may perform an up/down count operation, and thus, generate the pull-up calibration code PCODE[0:N]. A pull-up calibration operation is performed by repeating such an operation for generating the pull-up calibration code PCODE[0:N].

The second pull-up driver 218 may calibrate a resistance value of the second pull-up driver 218 in response to the pull-up calibration code PCODE[0:N]. As shown in FIG. 4, the second pull-up driver 218 may include the PMOS transistors 401 configured such that the pull-up calibration code PCODE[0:N] is input to gates of the PMOS transistors 401, and resistors 402 serially connected to the PMOS transistors 401. The PMOS transistors 401 and the resistors 402 may be located between the source of the power voltage VDD and a second node NB.

The second comparator 214, the second counter 215, and the first and second pull-up drivers 216 and 218, which perform a pull-up calibration operation based on the pull-up calibration code PCODE[0:N], may constitute a pull-up calibrator 230 (e.g., the second calibrator).

The third comparator 220 may compare a third reference voltage VREF3 to a voltage of the second node NB, and transmit a result of the comparing to the third counter 221 as an up/down signal UP/DN. The third comparator 220 may perform a comparing operation until a voltage of the second node NB becomes the same as the third reference voltage VREF3. According to example embodiments, the third reference voltage VREF3 may be the same as or different from the second reference voltage VREF2.

The third counter 221 may perform an up/down count operation in response to the up/down signal UP/DN of the third comparator 220, and thus, generate a pull-down calibration code NCODE[0:N]. The pull-down calibration code NCODE[0:N] may be provided to the first pull-down driver 222, and a second pull-down driver 244 (e.g., a data pull-down driver) included in the output driver 120.

The first pull-down driver 222 may calibrate a resistance value of the first pull-down driver 222 in response to the pull-down calibration code NCODE[0:N]. As shown in FIG. 5, the first pull-down driver 222 may include NMOS transistors 501 configured such that the pull-down calibration code NCODE[0:N] is input to gates of the NMOS transistors 501, and resistors 502 serially connected to the NMOS transistors 501. The NMOS transistors 501 and the resistors 502 are located between the second node NB and the source of the ground voltage VSS.

A voltage of the second node NB may be determined by distributing a voltage between the source of the power voltage VDD and the source of the ground voltage VSS according to a resistance value of the second pull-up driver 218 and a resistance value of the first pull-down driver 222. The third comparator 220, the third counter 221, and the first pull-down driver 222 may compare a voltage of the second node NB to the third reference voltage VREF3 until the voltage of the second node NB becomes the same as the third reference voltage VREF3. Then, according to a result of the comparison, the third comparator 220, the third counter 221, and the first pull-down driver 222 may perform an up/down count operation, and thus, generate the pull-down calibration code NCODE[0:N]. A pull-down calibration operation is performed by repeating such an operation for generating the pull-down calibration code NCODE[0:N].

The third comparator 220, the third counter 221, and the first pull-down driver 222, which perform a pull-down calibration operation based on the pull-down calibration code NCODE[0:N], may constitute a pull-down calibrator 232 (e.g., the third calibrator).

In example embodiments, each of the first through third comparators 204, 214 and 220 may be supplied by the power voltage VDD that is supplied from outside of the memory device 100. Each of the first through third counters 205, 215 and 221 may be supplied by an internal power voltage (e.g., VINT). An internal power voltage generator (not shown) of the memory device 100 may generate the internal power voltage VINT based on the power voltage VDD. A variation of the voltage level of the internal power voltage VINT may be less than the power voltage VDD. Thus, each of the first through third counters 205, 215 and 221 may precisely generate the trimming code TCODE[0:N], the pull-up calibration code PCODE[0:N], and the pull-down calibration code NCODE[0:N], respectively, even if the power voltage VDD is varied.

In the calibration circuit 110, an operation of the first calibration circuit 112 may be performed during a wafer test of the memory device 100, and an operation of the second calibration circuit 114 may be performed during a power-up sequence operation when the memory device 100 is in a package form. For example, the second calibration circuit 114 may be determined as operating in a period to which a ZQ calibration operation, defined by a standard for the memory device 100, is allocated. The trimming code TCODE[0:N] may be determined by the first calibration operation in a wafer form of the memory device 100, and the determined trimming code TCODE[0:N] may be stored in a first register (not shown). The first counter 205 may include the first register. The pull-up calibration code PCODE[0:N] and the pull-down calibration code NCODE[0:N] may be determined by the second calibration operation in a package form of the memory device 100, and the determined pull-up calibration code PCODE[0:N] and pull-down calibration code NCODE[0:N] may be stored in second and third registers (not shown), respectively. The second counter 215 may include the second register and the third counter 221 may include the third register.

According to an embodiment, first and second calibration operations of the calibration circuit 110 may be performed during a wafer test of the memory device 100.

According to another embodiment, first and second calibration operations of the calibration circuit 110 may be performed while the memory device 100 is in a package form. In this case, the pad 101 of the memory device 100 is connected to a first pin of the memory device 100 to communicate with outside (e.g., a memory controller) of the memory device 100. In one embodiment, the first pin of the memory device 100 is not used for a normal operation (e.g., read or write operation) of the memory device 100.

The pull-down calibration code NCODE[0:N] and the pull-up calibration code PCODE[0:N], generated in the calibration circuit 110, may be provided to the output driver 120. The pull-up calibration code PCODE[0:N] may be provided to the third pull-up driver 242 included in the output driver 120, and the pull-down calibration code NCODE[0:N] may be provided to the second pull-down driver 244 included in the output driver 120.

The third pull-up driver 242 may have a configuration the same as that of the first and second pull-up drivers 216 and 218. As shown in FIG. 4, the third pull-up driver 242 may include the PMOS transistors 401 configured such that the pull-up calibration code PCODE[0:N] is input to gates of the PMOS transistors 401, and resistors 402 serially connected to the PMOS transistors 401. The PMOS transistors 401 and the resistors 402 may be located between the source of the power voltage VDD and the DQ pad 102.

The third pull-up driver 242 may calibrate a resistance value of the third pull-up driver 242 in response to the pull-up calibration code PCODE[0:N]. A resistance value of the third pull-up driver 242 may be determined as a pull-up termination resistance value. A resistance value of the third pull-up driver 242 may be determined as a value the same as that of the first and second pull-up drivers 216 and 218 included in the calibration circuit 110. According to an embodiment, unlike a resistance value of the first and second pull-up drivers 216 and 218 in the calibration circuit 110, a resistance value of the third pull-up driver 242 may be determined as a value, for example, a half or a quarter of a resistance value of the first or second pull-up drivers 216 and 218.

The second pull-down driver 244 may be configured to be the same as the first pull-down driver 222 in the calibration circuit 110. As shown in FIG. 5, the second pull-down driver 244 may include the NMOS transistors 501 configured such that the pull-down calibration code NCODE[0:N] is input to gates of the NMOS transistor 501, and resistors 502 serially connected to the NMOS transistors 501. The NMOS transistors 501 and the resistors 502 may be located between the DQ pad 102 and the source of the ground voltage VSS.

The second pull-down driver 244 may calibrate a resistance value of the second pull-down driver 244 in response to the pull-down calibration code NCODE[0:N]. A resistance value of the second pull-up driver 244 may be determined as a pull-down termination resistance value. A resistance value of the second pull-down driver 244 may be determined as a value the same as that of the first pull-down driver 222 included in the calibration circuit 110. According to an embodiment, unlike a resistance value of the first pull-down driver 222 in the calibration circuit 110, a resistance value of the second pull-down driver 244 may be determined as a value, for example, a half or a quarter of a resistance value of the first pull-down driver 222.

The output driver 120 may selectively control the third pull-up driver 242 and the second pull-down driver 244. If the output driver 120 outputs logic high ("H") data to the DQ pad 102, the output driver 120 may turn on the third pull-up driver 242, and thus, termination of the DQ pad 102 is controlled to a logic high ("H") state. If the output driver 120 outputs logic low ("L") data to the DQ pad 102, the output driver 120 may turn on the second pull-down driver 244, and thus, termination of the DQ pad 102 is controlled to a logic low ("L") state.

The output driver 120 may receive data from a memory cell array (not shown) of the memory device 100, and a control signal to enable the third pull-up driver 242 or the second pull-down driver 244 based on a logic value of the data from the memory cell array when the memory device is in a normal operation (e.g., a read operation). For example, each of the pull-up calibration code PCODE[0:N] and pull-down calibration code NCODE[0:N] may include information of data from the memory cell array and the control signal.

Figure 6:
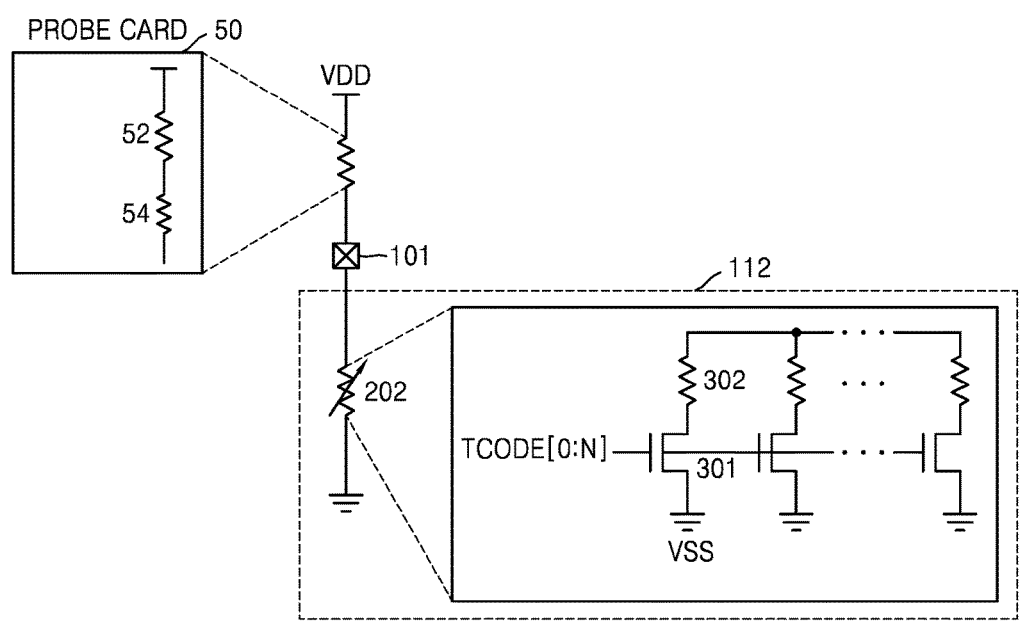
FIGS. 6, 7A, 7B, and 7C illustrate diagrams for explaining an operation of the calibration circuit shown in FIG. 2 according to example embodiments.
Figure 7A:
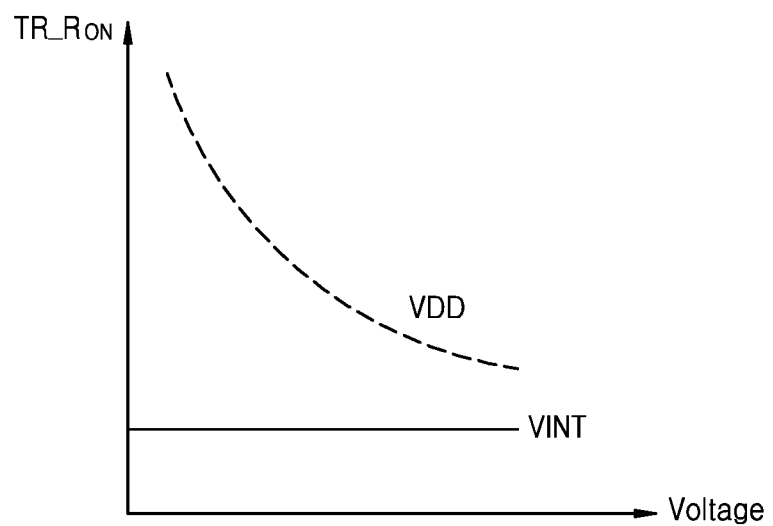
Figure 7B:
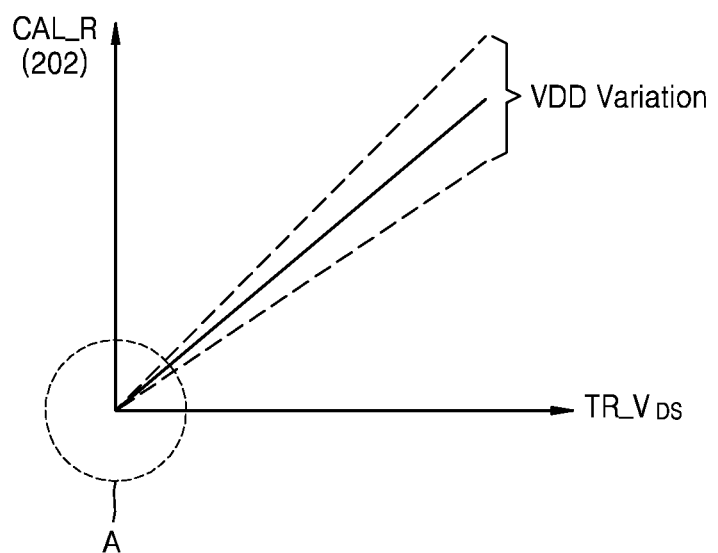
Figure 7C:
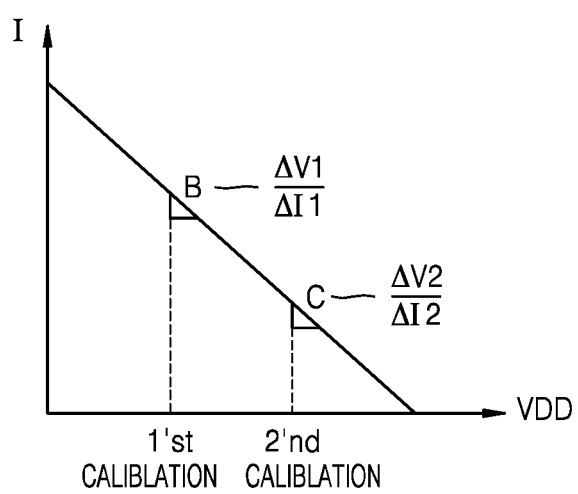

FIGS. 6, 7A, 7B, and 7C illustrate diagrams for explaining operation of the calibration circuit 110 shown in FIG. 2 according to example embodiments. FIG. 6 illustrates a diagram for explaining a part of the first calibration circuit 112. FIG. 7A illustrates a diagram showing characteristics of transistors included in the first reference resistor 202. FIG. 7B illustrates a diagram showing resistance characteristics of the first reference resistor 202. FIG. 7C illustrates a diagram showing current-voltage characteristics of the pad 101 according to a calibration operation.

Referring to FIG. 6, the first calibration circuit 112 may be connected to the test device 50 via the pad 101. If the test device 50 employs a probe card, the test device 50 has a structure such that both the external resistor 52 and a probe tip resistor 54 are connected to the pad 101. The probe tip resistor 54 may function as a parasitic resistor when the first calibration circuit 112 generates a trimming code TCODE[0:N] based on the external resistor 52.

The test device 50 may determine a resistance value of the external resistor 52 as being greater than that of the probe tip resistor 54, so as to ignore the probe tip resistor 54. According to an embodiment, a resistance value of the external resistor 52 in the test device 50 may vary depending on device characteristics such as process, voltage, or temperature variation (PVT) of the memory device 100 shown in FIG. 2, or the like.

If a resistance value of the external resistor 52 in the test device 50 is determined as being high, a voltage of the pad 101, obtained when a voltage is distributed between the external resistor 52 and the first reference resistor 202, may be decreased. A level of a first reference voltage VREF1 of the first comparator 204, shown in FIG. 2, may be determined as being low, in consideration of the decreased voltage of the pad 101. For example, the resistance value of the external resistor 52 in the test device 50 may be 5-10 times the resistance value of the first reference resistor 202.

One or more NMOS transistors 301 included in the first reference resistor 202 may be turned on in response to the trimming code TCODE[0:N]. A turn-on resistor $TR\_R_{ON}$ of each of the NMOS transistors 301 may be required to be constant according to a voltage level of the trimming code TCODE[0:N]. The turn-on resistor $TR\_R_{ON}$ of each of the NMOS transistors 301 needs to be constant so as to enhance accuracy of a trimmed resistance value of the first reference resistor 202.

As shown in FIG. 7A, if one of the trimming code TCODE[0:N] has a level of a power voltage VDD, a resistance value of the turn-on resistor $TR\_R_{ON}$ of a corresponding one of the NMOS transistors 301 may change according to a variance of the power voltage VDD that is an operating voltage of the memory device 100 shown in FIG. 2. The trimming code TCODE[0:N] may be determined as having a voltage level of an internal power voltage VINT that may have a constant voltage level, so as to constantly maintain a resistance value of the turn-on resistor $TR\_R_{ON}$. The internal power voltage VINT may be provided by an internal power voltage generator included in the memory device 100.

A resistance value of the resistors 302 in the first reference resistor 202 may be determined as being greater than a resistance value of the turn-on resistor TR_RON in the NMOS transistors 301. In other words, a width of the NMOS transistors 301 may be increased so that the resistance value of the turn-on resistor TR_RON of the NMOS transistors 301 is less than the resistance value of the resistors 302 in the first reference resistor 202.

As shown in FIG. 7B, a resistance value CAL_R of the first reference resistor 202 may change according a variation of the power voltage VDD. It is desirable that the resistance value CAL_R of the resistors 302 may be determined in a section A where a variation of the power voltage VDD is small. Additionally, in the section A where a variation of the power voltage VDD is small, as a resistance value of the turn-on resistor $TR\_R_{ON}$ of each of the NMOS transistors 301 having a great width decreases, a drop of a drain-source voltage $TR\_V_{DS}$ of the NMOS transistors 301 also decreases.

FIG. 7C shows current-voltage characteristics of the pad 101 according to a first calibration operation performed by the first calibration circuit 112 and the first node NA according to a second calibration operation performed by the second calibration circuit 114, which are included in the calibration circuit 110 shown in FIG. 2, when a first reference voltage VREF1 is determined as being different from a second reference voltage VREF2 so as to reduce an effect of the probe tip resistor 54 shown in FIG. 6. In a graph showing the current-voltage characteristics, a first inclination B (e.g., $\Delta V1/\Delta I1$) with respect to a first calibration operation and a second inclination C (e.g., $\Delta V2/\Delta I2$) with respect to a second calibration operation are shown as being constant without a change. Thus, it may be understood that the calibration circuit 110 may have accurately performed a calibration operation for trimming the first reference resistor 202 and the second reference resistor 212 so that a resistance value of the first reference resistor 202 and a resistance value of the second reference resistor 212 are the same as that of the external resistor 52 in the test device 50.

Figure 8:
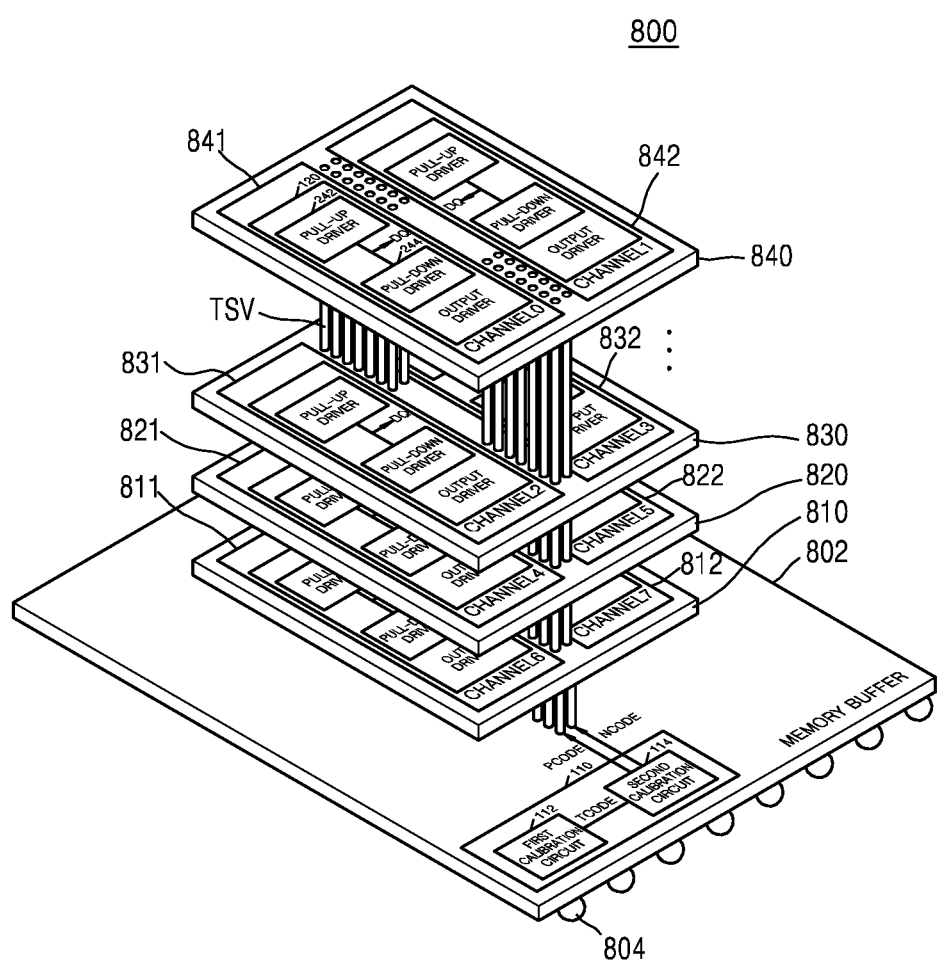
FIG. 8 illustrates a diagram for explaining a multichip package including a calibration circuit, according to certain embodiments.

FIG. 8 illustrates a diagram for explaining a multichip package 800 including the calibration circuit described above, according to certain embodiments. A multichip package refers to a semiconductor package in which a plurality of semiconductor chips or various types of semiconductor chips are stacked with each other so to form a package.

Referring to FIG. 8, the multichip package 800 may include a memory buffer 802 below memory layers 810 through 840 that are stacked with each other. The memory layers 810 through 840 may constitute a plurality of independent interfaces which are referred to channels. In example embodiments, each of the channels may be the memory device 100 described above. Thus, each of memory layers 810 through 840 may constitute, for example, a memory module. The memory layers 810 through 840 may respectively include two channels 811 and 812, 821 and 822, 831 and 832, and 841 and 842. The respective channels 811, 812, 821, 822, 831, 832, 841, and 842 include independent memory banks, and are independently clocked. For example, the channel 811 of the memory layer 810 may communicate with the memory buffer 802 in a first time period, and the channel 812 of the memory layer 810 may communicate with the memory buffer 802 in a second time period after the first time period.

In example embodiments, the multichip package 800, which is the semiconductor device 800, and in which the four memory layers 810 through 840 are stacked together and include the eight channels 811, 812, 821, 822, 831, 832, 841, and 842, is provided as an example. According to example embodiments, 2 to 8 memory layers may be stacked together in the semiconductor device 800. According to example embodiments, each of the memory layers 810 through 840 may include 1 to 4 channels. According to example embodiments, a channel may be distributed over a plurality of memory layers 810 through 840.

The memory buffer 802 may provide a signal distribution function of receiving a command, an address, a clock, and data from a memory controller, and providing the received command, address, clock, and data to the memory layers 810 through 840. Since the memory buffer 802 buffers all of the command, the address, the clock, and the data, the memory controller may interface with the memory layers 810 through 840 by driving only the memory buffer 802.

The memory buffer 802 and the memory layers 810 through 840 may transceive signals with each other via through-substrate vias (e.g., through-silicon vias TSVs). The memory buffer 802 may communicate with an external memory controller via a conductive element formed on an outer surface of the semiconductor device 800, for example, solder balls.

The memory buffer 802 may perform a calibration operation by using a solder ball 804 that is not used in a normal operation of the semiconductor device 800, from among the solder balls of the semiconductor device 800. In example embodiments, the memory buffer 802 may perform a calibration operation by using an internal pad included in the memory buffer 802. The memory buffer 802 may include the calibration circuit 110 connected to the solder ball 804. The calibration circuit 110 may include the first calibration circuit 112 connected to the solder ball 804 and configured to generate a trimming code TCODE, and a second calibration circuit 114 configured to generate a pull-up calibration code PCODE and a pull-down calibration code NCODE in response to the trimming code TCODE. The first calibration circuit 112 may generate a trimming code TCODE for trimming a first reference resistor based on an external resistor connected to the solder ball 804 and a first reference voltage. The second calibration circuit 114 may trim a second reference resistor in response to the trimming code TCODE, and generate a pull-up calibration code PCODE and a pull-down calibration code NCODE based on the trimmed second reference resistor and second and third reference voltages.

The pull-up calibration code PCODE and the pull-down calibration code NCODE may be provided to the channels 811, 812, 821, 822, 831, 832, 841, and 842 of the memory layers 810 through 840 via the through-silicon vias (TSVs).

The channels 811, 812, 821, 822, 831, 832, 841, and 842 of the memory layers 810 through 840 may include the output driver 120 connected to the data input/output pad DQ. According to example embodiments, the output driver 120 connected to the data input/output pad DQ may be arranged in an input/output (I/O) circuit included in the memory buffer 802. The output driver 120 may include a pull-up driver 242 for pull-up terminating the DQ pad in response to a pull-up calibration code PCODE, and a pull-down driver 244 for pull-down terminating the DQ pad in response to the pull-down calibration code NCODE. A signal of the DQ pad may be transmitted to the memory buffer 802 via a through-silicon via TSV, and also transmitted to a DQ solder ball.

Figure 9:
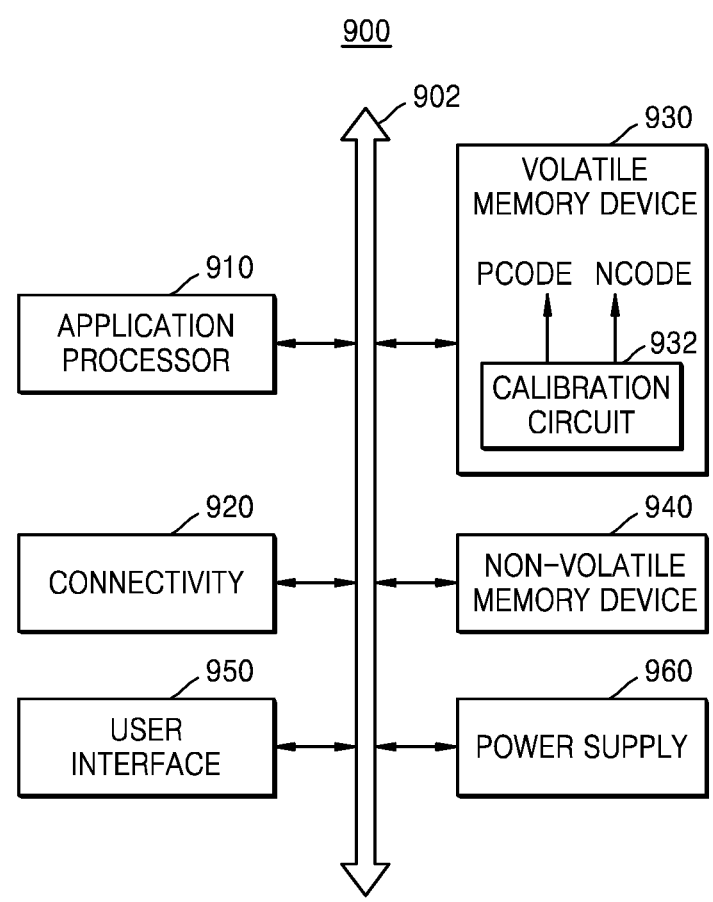
FIG. 9 is a block diagram showing an example of applying a memory device, which includes a calibration circuit, to a mobile system according to certain embodiments.

FIG. 9 is a block diagram showing an example of applying a memory device, which includes a calibration circuit, to a mobile system 900, according to certain embodiments.

Referring to FIG. 9, the mobile system 900 may include an application processor 910, a connectivity unit 920, a first memory device 930, a second memory device 940, a user interface 950, and a power supplier 960 which are connected to each other via a bus 902. The first memory device 930 may be configured as a volatile memory device, and the second memory device 940 may be configured as a non-volatile memory device.

According to example embodiments, the mobile system 900 may be an arbitrary mobile system such as a mobile phone, a smartphone, a personal digital assistant (PDA), a portable multimedia player (PMP), a digital camera, a music player, a portable game console, a navigation system, or the like.

The application processor 910 may execute applications providing an internet browser, a game, a moving image, or the like. According to embodiments, the application processor 910 may include a single core or multiple cores. For example, the application processor 910 may be a dual-core, quad-core, or hexa-core processor. According to embodiments, the application processor 910 may further include a cache memory located inside or outside the application processor 910.

The connectivity unit 920 may perform wired or wireless communication with an external device. For example, the connectivity unit 920 may perform Ethernet communication, near-field communication (NFC), radio frequency identification (RFID) communication, mobile telecommunication, memory card communication, universal serial bus (USB) communication, or the like. For example, the connectivity unit 920 may include a baseband chipset, and support communication such as GSM, GRPS, WCDMA, HSxPA, or the like.

The first memory device 930 that is a volatile memory device may store data processed by the application processor 910 as write data, or operate as a working memory. The first memory device 930 may include a calibration circuit 932 for generating a pull-up calibration code PCODE and a pull-down calibration code NCODE for terminating a data input/output pad, for obtain impedance matching in the data input/output pad. The calibration circuit 932 may be the same as the calibration circuit 110 described herein. The calibration circuit 932 may perform a first calibration operation for trimming first and second reference resistors based on an external resistor connected to a pad that is not used in a normal operation (e.g., a read or write operation) of the first memory device 930, and a second calibration operation for generating a pull-up calibration code PCODE and a pull-down calibration code NCODE based on the trimmed second reference resistor. The first memory device 930 may accurately perform impedance matching of the data input/output pad, by terminating the data input/output pad in response to the pull-up calibration code PCODE and the pull-down calibration code NCODE.

The second memory device 940 that is a non-volatile memory device may store a boot image for booting the mobile system 900. For example, the non-volatile memory device 940 may be implemented as an electrically erasable programmable read-only memory (EEPROM), flash memory, phase change random access memory (PRAM), resistive random access memory (RRAM), nano floating gate memory (NFGM), polymer random access memory (PoRAM), magnetic random access memory (MRAM), ferroelectric random access memory (FRAM), or a memory similar thereto.

The user interface 950 may include one or more input devices such as a keypad or a touchscreen and/or one or more output devices such as a speaker or a display device. The power supplier 960 may supply a working voltage to the mobile system 900. Additionally, according to embodiments, the mobile system 900 may further include a camera image processor (CIP), and further include a storage device such as a memory card, a solid state drive (SSD), a hard disk drive (HDD), a compact disk-read only memory (CD-ROM), or the like.

Figure 10:
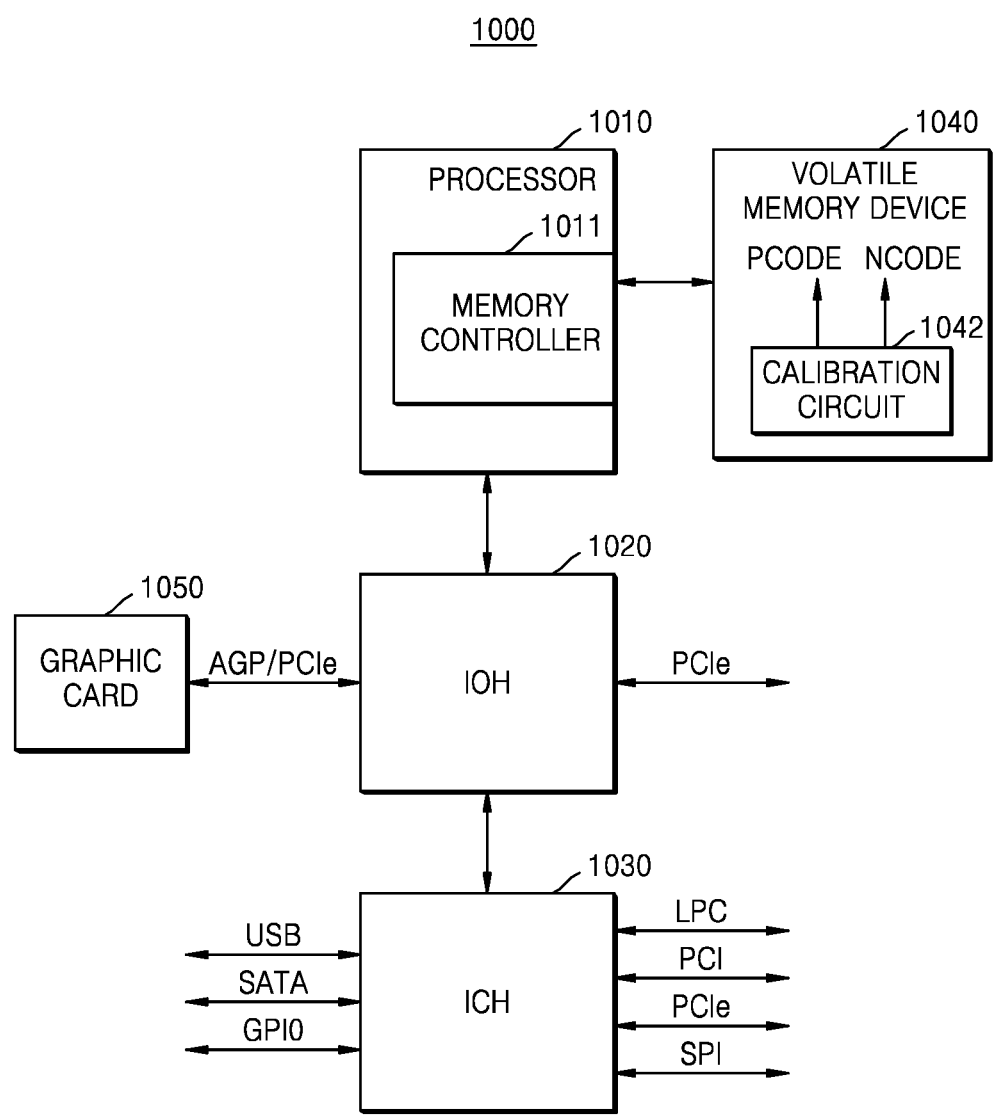
FIG. 10 is a block diagram showing an example of applying a memory device, which includes a calibration circuit, to a computing system, according to certain embodiments.

FIG. 10 is a block diagram showing an example of applying a memory device, which includes a calibration circuit, to a computing system 1000, according to certain embodiments.

Referring to FIG. 10, the computing system 1000 includes a processor 1010, an input/output hub 1020, an input/output controller hub 1030, a memory device 1040, and a graphic card 1050. According to embodiments, the computing system 1000 may be an arbitrary computing system such as a personal computer (PC), a server computer, a workstation, a laptop computer, a mobile phone, a smartphone, a PDA, a PMP, a digital camera, a digital TV, a set-top box, a music player, a portable game console, a navigation system, or the like.

The processor 1010 may perform various computing functions such as particular calculation or tasks. For example, the processor 1010 may be a microprocessor or a central processing unit (CPU). According to embodiments, the processor 1010 may include a single core or multiple cores. For example, the processor 1810 may include a dual-core, quad-core, or hexa-core processor. FIG. 10 shows the computing system 1000 that includes a processor 1010. However, according to embodiments, the computing system 1010 may include a plurality of processors. Additionally, according to embodiments, the processor 1010 may further include a cache memory located inside or outside the processor 1010.

The processor 1010 may include a memory controller 1011 for controlling an operation of the memory device 1040. The memory controller 1011 included in the processor 1010 may be referred to as an integrated memory controller (IMC). According to embodiments, the memory controller 1011 may be located in the input/output hub 1020. The input/output hub 1020 that includes the memory controller 1011 may be referred to as a memory controller hub (MCH).

The memory device 1040 includes a calibration circuit 1042 for generating a pull-up calibration code PCODE and a pull-down calibration code NCODE for terminating a data input/output pad, for impedance matching in the data input/output pad. The calibration circuit 1042 may be the same as the calibration circuit 110 described herein. The calibration circuit 1042 may perform a first calibration operation for trimming first and second reference resistors based on an external resistor connected to a pad that is not used in a normal operation (e.g., a read or write operation) of the memory device 1040, and a second calibration operation for generating a pull-up calibration code PCODE and a pull-down calibration code NCODE based on the trimmed second reference resistor. The memory device 1040 may accurately perform impedance matching of the data input/output pad, by terminating the data input/output pad in response to the pull-up calibration code PCODE and the pull-down calibration code NCODE.

The input/output hub 1020 may manage data transmission between the processor 1010 and devices such as the graphic card 1050. The input/output hub 1020 may be connected to the processor 1010 via various types of interfaces. For example, the input/output hub 1020 and the processor 1010 may be connected to each other via various standards of interfaces such as a front side bus (FSB), a system bus, HyperTransport, lightning data transport (LDT), quickpath interconnect (QPI), a common system interface, peripheral component interfaceeExpress (CSI), or the like. FIG. 10 shows the computing system 1000 that includes the input/output hub 1020. However, the computing system 1000 may include a plurality of input/output hubs.

The input/output hub 1020 may provide various interfaces with devices. For example, the input/output hub 1020 may provide an accelerated graphics port (AGP) interface, peripheral component interface-express (PCIe), a communications streaming architecture (CSA) interface, or the like.

The graphic card 1050 may be connected to the input/output hub 1020 via an AGP or PCIe. The graphic card 1050 may control a display device (not shown) for displaying an image. The graphic card 1050 may include an internal processor and an internal semiconductor memory device for processing image data. According to embodiments, the input/output hub 1020 may include a graphics device in the input/output hub 1020 instead of the graphics card 1050, or may include a graphics device in the input/output hub 1020 in addition to the graphics card 1050 that is located outside the input/output hub 1020. The graphic device included in the input/output hub 1050 may be referred to as integrated graphics. Additionally, the input/output hub 1020 that includes a memory controller and a graphics device may be referred to as a graphics and memory controller hub (GMCH).

The input/output controller hub 1030 may perform data buffering and interface mediation so that various system interfaces may efficiently operate. The input/output controller hub 1030 may be connected to the input/output hub 1020 via an internal bus. For example, the input/output hub 1020 and the input/output controller hub 1030 may be connected to each other via a direct media interface (DMI), a hub interface, an enterprise southbridge interface (ESI), PCIe, or the like.

The input/output controller hub 1030 may provide various interfaces with peripheral devices. For example, the input/output controller hub 1030 may provide a USB port, a serial advanced technology attachment (SATA) port, a general purpose input/output (GPIO), a low pin count (LPC) bus, a serial peripheral interface (SPI), PCI, PCIe, or the like.

According to embodiments, two or more elements, from among the processor 1010, the input/output hub 1020, and the input/output controller hub 1030, may be implemented as a chipset.

While the present disclosure has been particularly shown and described with reference to embodiments thereof, it will be understood that various changes in form and details may be made therein without departing from the spirit and scope of the following claims.

What is claimed is:

1. A calibration circuit of a memory device, the calibration circuit comprising:
    a first calibration circuit configured to generate a trimming code for trimming a first reference resistor, based on an external resistor to be connected to a pad of the memory device; and
    a second calibration circuit configured to trim a second reference resistor in response to the trimming code, and to generate a pull-up calibration code and a pull-down calibration code based on the trimmed second reference resistor,
    wherein the memory device includes a pull-up driver configured to receive the pull-up calibration code and a pull-down driver configured to receive the pull-down calibration code,
    wherein the pull-up driver and the pull-down driver are connected to a data input/output pad of the memory device, and
    wherein termination of the data input/output pad is controlled in response to the pull-up calibration code and the pull-down calibration code.

2. The calibration circuit of claim 1, wherein the first reference resistor and the second reference resistor are trimmed to have a resistance value the same as that of the external resistor.

3. The calibration circuit of claim 1, wherein the data input/output pad of the memory device is configured to be connected to outside of the memory device and the pad of the memory device is configured to be not connected to outside of the memory device.

4. The calibration circuit of claim 1, wherein the first calibration circuit comprises:
    the first reference resistor connected between the pad and a ground voltage source, and configured to have a resistance value that varies according to the trimming code;
    a first comparator configured to compare a voltage of the pad to a first reference voltage, and to output a first up/down signal; and
    a first counter configured to perform an up/down count operation in response to the first up/down signal, and to generate the trimming code.

5. The calibration circuit of claim 4, wherein the first comparator is supplied by a power voltage, and wherein the first counter is supplied by an internal power voltage generated by an internal power generator of the memory device based on the power voltage.

6. The calibration circuit of claim 4, wherein the second calibration circuit comprises:
the second reference resistor connected between a first node and the ground voltage source, and configured to have a resistance value that varies according to the trimming code;
a pull-up calibrator connected between the first node and a second node, and configured to compare a voltage of the first node to a second reference voltage, perform an up/down count operation according to a result of the comparison, and to output the pull-up calibration code; and
a pull-down calibrator configured to compare a third reference voltage to a voltage of the second node, perform an up/down count operation according to a result of the comparison, and to output the pull-down calibration code.

7. The calibration circuit of claim 6, wherein the pull-up calibrator comprises:
a second comparator configured to compare the voltage of the first node to the second reference voltage, and to output a second up/down signal;
a second counter configured to perform an up/down count operation in response to the second up/down signal, and to generate the pull-up calibration code;
a first pull-up driver connected between a power voltage source and the first node, and configured to have a resistance value that varies according to the pull-up calibration code; and
a second pull-up driver connected between the power voltage source and the second node, and configured to have a resistance value that varies in response to the pull-up calibration code.

8. The calibration circuit of claim 7, wherein the pull-down calibrator comprises:
a third comparator configured to compare the third reference voltage to a voltage of the second node, and to output a third up/down signal;
a third counter configured to perform an up/down count operation in response to the third up/down signal, and to generate the pull-down calibration code; and
a first pull-down driver connected between the second node and the ground voltage source, and configured to have a resistance value that varies in response to the pull-down calibration code.

9. A memory device comprising:
a memory buffer comprising conductive terminals to perform an external interfacing function of the memory device; and
memory layers stacked on the memory buffer, electrically connected to the memory buffer via through substrate vias, and each of the memory layers comprising channels providing an interface independent from the memory buffer,
wherein the memory buffer comprises a calibration circuit configured to trim a first reference resistor and a second reference resistor based on an external resistor to be connected to a conductive terminal, and to generate a pull-up calibration code and a pull-down calibration code based on the trimmed second reference resistor, and
wherein termination of a data input/output pad (a DQ pad) of each of the channels is controlled in response to the pull-up calibration code and the pull-down calibration code.

10. The memory device of claim 9, wherein the DQ pad is connected to an output driver including a pull-up driver configured to be controlled in response to the pull-up calibration code, and including a pull-down driver configured to be controlled in response to the pull-down calibration code, and
wherein the output driver is arranged either in each of the channels or in the memory buffer.

11. The memory device of claim 9, wherein the calibration circuit comprises:
a first calibration circuit configured to generate a trimming code for trimming the first reference resistor, based on the external resistor and a first reference voltage; and
a second calibration circuit configured to trim the second reference resistor in response to the trimming code, to generate the pull-up calibration code based on a second reference voltage, and to generate the pull-down calibration code based on a third reference voltage.

12. The memory device of claim 11, wherein the first calibration circuit is configured to perform a first calibration operation on the memory device in wafer form, and
wherein the second calibration circuit is configured to perform a second calibration operation on the memory device in package form.

13. The memory device of claim 11, wherein each of the memory layers includes a first counter configured to generate the trimming code, the first counter is supplied by an internal power voltage provided by an internal power voltage generator included in the memory device.

14. The calibration circuit of claim 11, wherein the first calibration circuit comprises:
the first reference resistor connected between the conductive terminal and a ground voltage source, and configured to have a resistance value that varies according to the trimming code;
a first comparator configured to compare a voltage of the conductive terminal to the first reference voltage, and to output a first up/down signal; and
a first counter configured to perform an up/down count operation in response to the first up/down signal, and to generate the trimming code.

15. The calibration circuit of claim 14, wherein the second calibration circuit comprises:
the second reference resistor connected between a first node and the ground voltage source, and configured to have a resistance value that varies according to the trimming code;
a second comparator configured to compare a voltage of the first node to the second reference voltage, and to output a second up/down signal;
a second counter configured to perform an up/down count operation in response to the second up/down signal, and to generate the pull-up calibration code;
a first pull-up driver connected between a power voltage source and the first node, and configured to have a resistance value that varies according to the pull-up calibration code; and
a second pull-up driver connected between the power voltage source and a second node, and configured to have a resistance value that varies in response to the pull-up calibration code;

a third comparator configured to compare the third reference voltage to a voltage of the second node, and to output a third up/down signal;

a third counter configured to perform an up/down count operation in response to the third up/down signal, and to generate the pull-down calibration code; and a first pull-down driver connected between the second node and the ground voltage source, and configured to have a resistance value that varies in response to the pull-down calibration code.

16. A memory device comprising:

a DQ pad;

an output driver including a pull-up driver and a pull-down driver each connected to the DQ pad and configured to provide a data signal to the DQ pad; and a calibration circuit configured to generate a trimming code to trim a first reference resistor and a second reference resistor based on an external resistor to be connected to an internal pad, and configured to generate a pull-up calibration code and a pull-down calibration code provided to the pull-up driver and the pull-down driver, respectively, based on the trimmed second reference resistor, wherein the DQ pad is configured to be connected to outside of the memory device and the internal pad is configured to be not connected to outside of the memory device.

17. The memory device of claim 16, wherein the calibration circuit includes:

a first calibrator including a first comparator configured to compare a voltage of the internal pad connected to the trimmed first reference resistor to a first reference voltage, and including a first counter configured to generate the trimming code based on a result from the comparison of the first comparator, a second calibrator connected between a first node and a second node, including a second comparator configured to compare a voltage of the first node connected to the trimmed second reference resistor to a second reference voltage, and including a second counter configured to generate the pull-up calibration code based on a result from the comparison of the second comparator, and a third calibrator including a third comparator configured to compare a voltage of the second node to a third reference voltage, and including a third counter configured to generate the pull-down calibration code based on a result from the comparison of the third comparator.

18. The memory device of claim 17, wherein the first through third comparators are supplied by a power voltage, and wherein at least one of the first through third counters is supplied by an internal power voltage generated by an internal power generator of the memory device.

19. The memory device of claim 18, wherein a voltage level of the first reference voltage is less than a half power voltage and a voltage level of each of the second and third reference voltages is a half power voltage.

20. The memory device of claim 17, wherein a voltage level of the first reference voltage is less than a voltage level of the second or third reference voltage.

* * * * *